US008675806B2

(12) United States Patent
Dulka et al.

(10) Patent No.: US 8,675,806 B2
(45) Date of Patent: Mar. 18, 2014

(54) DIELECTRIC COATING FOR SURFACES EXPOSED TO HIGH TEMPERATURE WATER

(75) Inventors: Catherine Procik Dulka, West Chester, PA (US); Young Jin Kim, Clifton Park, NY (US); Rajasingh Schwartz Israel, Westlake, OH (US); David Wesley Sandusky, Los Gatos, CA (US); Kevin H. Janora, Schenectady, NY (US); Peter W. Brown, Twinsburg, OH (US); Tianji Zhao, Mayfield Heights, OH (US)

(73) Assignee: General Electric Company, Schenectady, NY (US)

( * ) Notice: Subject to any disclaimer, the term of this patent is extended or adjusted under 35 U.S.C. 154(b) by 31 days.

(21) Appl. No.: 13/234,578

(22) Filed: Sep. 16, 2011

(65) Prior Publication Data
US 2014/0029712 A1  Jan. 30, 2014

Related U.S. Application Data

(62) Division of application No. 11/024,952, filed on Dec. 30, 2004, now Pat. No. 8,023,609.

(51) Int. Cl.
G21C 9/00 (2006.01)
(52) U.S. Cl.
USPC ........... 376/305; 376/277; 376/347; 376/361; 376/402; 376/407
(58) Field of Classification Search
None
See application file for complete search history.

(56) References Cited

U.S. PATENT DOCUMENTS

| 4,297,150 | A | | 10/1981 | Foster et al. |
| 4,364,900 | A | | 12/1982 | Burrill |
| 4,828,790 | A | | 5/1989 | Honda et al. |
| 5,137,683 | A | | 8/1992 | Hertz et al. |
| 5,147,597 | A | | 9/1992 | Roofthooft et al. |
| 5,510,173 | A | * | 4/1996 | Pass et al. ...................... 428/216 |
| 6,254,341 | B1 | | 7/2001 | Ackerman et al. |
| 6,416,870 | B1 | * | 7/2002 | Hunt et al. .................... 428/450 |

(Continued)

FOREIGN PATENT DOCUMENTS

EP   1 211 695   3/2010
JP   63-274751   11/1988

(Continued)

OTHER PUBLICATIONS

Japanese Office Action dated Sep. 27, 2011 issued in Japanese Application No. 2005-371381.

Primary Examiner — Jack W Keith
Assistant Examiner — Marshall O'Connor
(74) Attorney, Agent, or Firm — Harness, Dickey & Pierce, P.L.C.

(57) ABSTRACT

Example embodiments relate to a method and apparatus for reducing electrostatic deposition of charged particles on wetted surfaces that are exposed, periodically or substantially continuously, to high velocity fluid flow within a coolant flow path in a nuclear reactor. The method may include depositing a first or base dielectric layer and a second or outer dielectric layer on a conductive surface that forms a portion of a high velocity flow path to attain the apparatus. The first dielectric layer material is selected to provide improved adhesion and insulation to the conductive surface and the second dielectric layer material is selected to provide suitable adhesion to the first dielectric layer and improved corrosion and/or mechanical resistance in the anticipated operating environment.

4 Claims, 3 Drawing Sheets

(56) References Cited

U.S. PATENT DOCUMENTS

| | | | |
|---|---|---|---|
| 6,551,719 B2 | 4/2003 | Furuya et al. | |
| 6,630,202 B1 | 10/2003 | Dulka et al. | |
| 6,633,623 B2 * | 10/2003 | Dulka et al. | 376/306 |
| 6,940,939 B1 | 9/2005 | Ichikawa et al. | |
| 2002/0101952 A1 | 8/2002 | Dulka et al. | |
| 2006/0050833 A1 | 3/2006 | Ichikawa et al. | |
| 2006/0073356 A1 * | 4/2006 | Justin et al. | 428/660 |
| 2007/0202351 A1 * | 8/2007 | Justin et al. | 428/660 |

FOREIGN PATENT DOCUMENTS

| | | |
|---|---|---|
| JP | 07-228963 | 8/1995 |
| JP | 10-130810 | 5/1998 |
| JP | 2001-004789 | 1/2001 |
| JP | 2001-276628 | 10/2001 |
| JP | 2002-207094 | 7/2002 |
| JP | 2004-333468 | 11/2004 |

* cited by examiner

DIELECTRIC COATING FOR SURFACES EXPOSED TO HIGH TEMPERATURE WATER

CROSS-REFERENCE TO RELATED APPLICATION

This U.S. nonprovisional application is a divisional under 35 U.S.C. §121 of U.S. application Ser. No. 11/024,952, filed Dec. 30, 2004, now U.S. Pat. No. 8,023,609 the disclosure of which is hereby incorporated herein in its entirety by reference.

BACKGROUND

The present invention relates to an apparatus and methods for eliminating or substantially inhibiting electrostatic deposition of charged particles from the coolant onto the surface of an inlet-mixer of a jet pump forming part of a water recirculation system in a boiling water nuclear reactor, and for inhibiting stress corrosion cracking of the metallic parts. This invention particularly relates to an insulating barrier coating that eliminates or substantially inhibits the interaction between the conductive metal housing of the inlet-mixer of the jet pump assembly and the ionic particles in the fluid.

In a boiling water nuclear reactor, an annular space is defined between the core shroud and the reactor pressure vessel wall. Jet pumps are located in the annular space for recirculating coolant through the reactor. The recirculation system circulates the cooling medium around the nuclear reactor core. Jet pumps, which contain no moving parts, provide an internal circulation path for the core coolant flow. Typically, a substantial number of jet pumps, for example, on the order of sixteen to twenty-four, are installed in this annular space. Each jet pump assembly consists of a riser assembly, a riser brace, two inlet-mixer assemblies, and two diffuser assemblies. The inlet-mixer includes a nozzle and a suction inlet. The nozzle may have one orifice or five orifices, depending on the jet pump design. The top of the inlet-mixer is mechanically clamped to the top of the riser transition piece, while the exit end of the inlet-mixer fits into a slip joint with the top of the diffuser. The inlet-mixer is a removable component.

A recirculation pump, external to the reactor vessel, pulls suction from the downward flow of coolant in the annular space. The coolant is pumped to a higher pressure, and is distributed through a manifold to the jet pumps, where the coolant flows in an upward direction through the risers. The coolant splits in the transition piece and changes direction. It is then accelerated in a downward direction through the nozzles and into a mixer section of the jet pump. The nozzles cause a high velocity coolant flow that is approximately one third of the core flow and discharges into the inlet-mixers. Momentum causes surrounding water in the downcomer region of the annulus to also enter the mixer section where it mixes with the outflow from the nozzles for flow through the mixer section and diffuser. This combined flow discharges into the lower core plenum. The coolant then flows upward between the control rod drive guide tubes and is distributed for flow along individual fuel rods inside the fuel channels.

Over time, contaminants tend to accumulate on the inside surface of the inlet-mixers including the jet pump nozzles, forming a layer of "crud." There is also potential for stress corrosion cracking along these surfaces. The build-up of "crud" is attributed, at least in part, to charged particles suspended in the coolant which interact with the metallic inner surface of the inlet-mixer inducing a triboelectrostatic charge on the surface. This charge creates an electrostatic potential that attracts the suspended particles in the fluid to the metallic surface where they form a layer of particle contaminants. The greatest deposition of "crud" tends to be observed in areas that experience a high velocity flow rate.

The accumulation of the layer of "crud" will tend to degrade the performance of the recirculation system. If the accumulation is excessive, this degradation will affect the efficiency of the plant because the recirculation pumps must be run at a higher speed to maintain core flow. Degradation of jet pump performance can also result in extreme jet pump vibration and damage to jet pump components. Eventually, the inlet-mixer must be mechanically cleaned or replaced during regular maintenance and refueling outages. This process is expensive and time consuming. Consequently, it is important that the accumulation of this layer of "crud" be suppressed or substantially eliminated in order to preserve a clear flow path and maintain the performance of the recirculation system.

In the past, cleaning processes have been proposed that remove the "crud" layer from the inside surface of the inlet-mixer. These processes require removal of the inlet-mixer from the reactor for cleaning in the fuel pool. This is typically accomplished at regular scheduled shutdowns of the reactor, at which times the necessary maintenance is performed. A process using an electrical circuit has also been proposed for reducing the electrostatic deposition of charged particles on the inlet-mixer surfaces that are exposed to the free stream electrical potential in U.S. Pat. No. 5,444,747. This process employs a DC circuit with an active element feedback loop that adjusts the surface potential of the inlet-mixer to minimize the net flux to the inner conducting surface of the parts and thereby reduces particulate deposition. Implementation of this process, however, requires significant attention and maintenance and adds to the overall complexity of the recirculation system.

Accordingly, there remains a need for apparatus and methods of protecting the inlet-mixers of the jet pumps from contaminant build-up. Furthermore, there remains a need for a solution to the problem of "crud" build-up which gradually degrades their performance and requires the need for periodically cleaning and maintaining the jet pump.

SUMMARY

An exemplary embodiment of the invention provides a coating on the inlet-mixer surfaces to reduce the electrostatic potential between the ionic fluid flow and such surfaces and thereby suppress or eliminate the build-up of crud. By reducing the electrostatic potential, the coating inhibits or reduces the formation of a particulate layer on the coated surfaces. Furthermore, the insulative coating tends to reduce the susceptibility of the coated inlet-mixer surfaces to stress corrosion cracking by lowering the electrochemical corrosion potential (ECP).

To achieve these improvements, the interior surfaces of the inlet-mixers are provided with a coating which reduces or eliminates the build-up of charged particles on those surfaces. Particularly, the interior surfaces of each inlet-mixer are coated with a dielectric material that will tend to insulate the surfaces of these parts electrically from the fluid flow. This insulating layer will tend to suppress the development of an electrostatic potential typically resulting from triboelectrostatic charge induced on the conductive inner surfaces of the inlet-mixer. By suppressing the development of an electrostatic potential, the insulating layer will suppress the potential for interaction between the surface and charged particles suspended in the water.

Thus, the coating tends to suppress or eliminate electrochemical interaction between the conductive housing surfaces and the ionic particles in the coolant. Because the charged particles are not attracted to the dielectric-coated surface to the degree that they are attracted to an uncoated conductive surface, the potential crud-forming or contaminating particles tend to pass through the inlet-mixer without being deposited on the interior surfaces of the inlet-mixer. The dielectric coating, therefore, reduces or eliminates the need for costly cleaning and maintenance of the jet pump and maintains the flow path clear of these potential contaminants.

The dielectric coating electrochemically isolates the conductive surfaces from the reactor water and tends to retard diffusion of oxygen from the reactor water to the metal surfaces. These effects tend to reduce susceptibility to stress corrosion cracking of the metallic parts.

The main purpose of this disclosure is to increase the performance and lifetime of the dielectric coating applied to components used in light water reactors such as Boiling Water Reactors (BWR), Pressurized Water Reactors (PWR), CANDU reactors, etc., such as jet pump nozzles/inlet mixers to reduce the oxide fouling on high flow surfaces. It is proposed to apply a dual coat; for example first to apply a thin layer of $Ta_2O_5$, or $ZrO_2$, or other dielectric coating followed by another layer of $TiO_2$ or other dielectric coating. This novel treatment will allow for a more electrically resistant coat in addition to a more adherent coat. For example, it has been shown that a $Ta_2O_5$ coating provides an excellent adherence to various substrates. In addition, the $TiO_2$ layer will have a greater adherence to the $Ta_2O_5$ layer compared to its adherence to the base material of interest.

This dual-coat approach may be applied to replacement components such as core spray piping to improve resistance to stress corrosion cracking and other forms of corrosion, such as erosion corrosion. As used herein, erosion corrosion refers to corrosion of a metal that is caused or accelerated by the relative motion of the environment and the metal surface and is typically characterized by surface features with a directional pattern which are a direct result of the flowing media. Other factors such as turbulence, cavitation, impingement or galvanic effects can add to the severity of the corrosion. Other potential applications are impellers, flow elements, valves, other applications which are exposed to high flow water and are susceptible to fouling from the charged ions in the fluid.

The coating is preferably an insulating metal oxide coating, e.g., a coating formed of $TiO_2$ or $Ta_2O_5$, although other materials as described below may also be employed as either of the coating layers. The coating is applied by placing the part, such as a nozzle assembly, in a heated vacuum reactor vessel. Once the desired reaction conditions have been achieved, one or more suitable chemical precursors, e.g., $Ti(OC_2H_5)_4$ or $Ta(OC_2H_5)_5$, are introduced into the system. These precursor compounds thermally decompose on the surface of the part being processed, producing the dielectric coating and releasing several byproduct gases. The product is then cooled and ready for installation in the nuclear reactor.

In an exemplary embodiment according to the present invention, there is provided a multi-layer dielectric coating for reducing or eliminating deposition of charged particulates on the wetted surfaces of the flow passages of a jet pump in a boiling water reactor.

In another exemplary embodiment according to the present invention, there is provided a method for forming a multi-layer dielectric coating for reducing or eliminating deposition of charged particulates on the wetted surfaces of the flow passages of a jet pump in a boiling water reactor.

Figure 1:
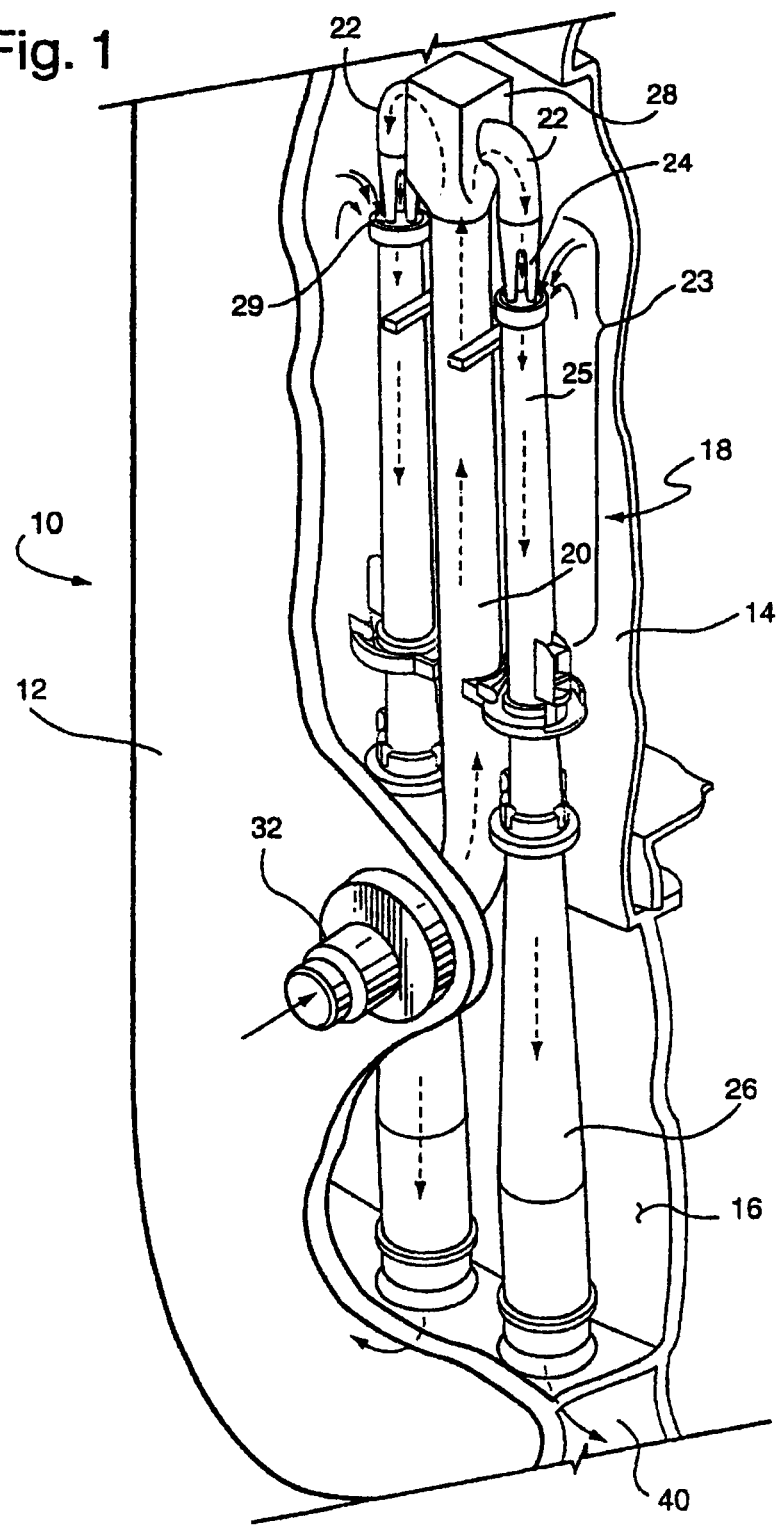
FIG. 1 is a fragmentary perspective view with portions broken out of a jet pump in an annular space between the inner shroud and the pressure vessel wall of a nuclear reactor.

These drawings have been provided to assist in the understanding of the exemplary embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION

As illustrated in FIG. 1, a conventional reactor will include a reactor pressure vessel 10 that includes a reactor pressure vessel wall 12 and an inner core shroud 14 defining a generally annular space 16 therebetween that contains coolant. As in a typical BWR, a plurality of jet pumps, one being generally designated 18, are disposed at circumferential spaced positions surrounding the pressure vessel in the annular space 16 defined between the pressure vessel wall 12 and the core shroud 14. Each jet pump 18 typically comprises an inlet riser 20, a transition piece 28 adjacent the upper end of the inlet riser 20, a pair of elbows 22, inlet-mixers 23, each including nozzles 24 and mixing sections 25, and diffusers 26. Hold down assemblies adjacent the top of the jet pump 18, together with a number of braces and restraining assemblies maintain each jet pump 18 in a substantially fixed position in the annular space 16 between the core shroud 14 and pressure vessel wall 12. A thermal sleeve 32 penetrates the pressure vessel wall 12 and is welded at its juncture with an inlet elbow with the opposite end of the inlet elbow being secured to the lower end of the inlet riser 20.

It will be appreciated that the foregoing-described jet pump 18 is conventional in construction. Thus, coolant enters the thermal sleeve 32 and flows through the elbow, upwardly in the inlet riser 20, through the inlet elbows 22 through nozzles 24 for flow in a downward direction through the mixing sections 25, the diffusers 26 and into a plenum 40 for upward flow through the reactor core. During conventional operation, the jet pump nozzles 24 will induce a suction flow of coolant from the annular space 16 into the mixing section 25 which mixes with the coolant flow through the jet pump nozzles 24.

Figures 2, 3:
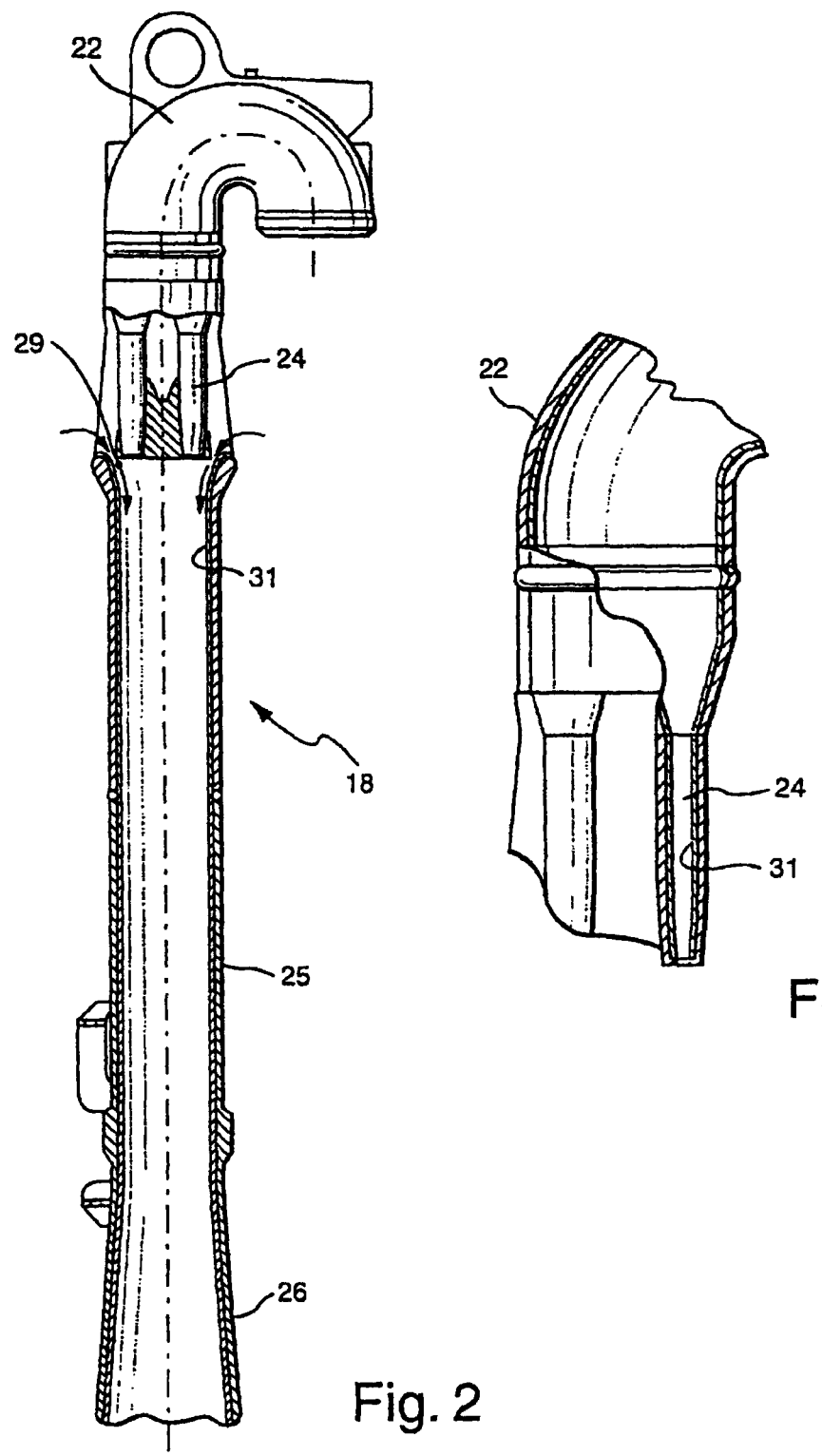
FIG. 2 is an enlarged elevation view of a transition piece adjacent the top of the pump, an inlet-mixer, and a diffuser with parts in cross-section for ease of illustration.
FIG. 3 is an enlarged fragmentary cross-sectional view of a nozzle discharge port of the inlet-mixer.

Illustrated more particularly to FIG. 2 is a portion of a jet pump 18 having an inlet elbow 22 adjacent five nozzles 24. The nozzles 24 are supported above the mixing sections 25 and, in combination with the mixing sections define a generally annular suction flow passage 29 between the nozzles 24 and an inlet to the mixing section 25. It will be appreciated that the mixing section 25 is typically a generally cylindrical pipe which terminates at its lower end in an inlet to the diffuser 26. Consequently, the flow of coolant through the nozzles 24 induces a suction flow of coolant through the annular spacer 16 for flow into the mixing section 25. These combined nozzle and suction flows pass through the mixing section 25 and diffuser 26 and into plenum 40.

Illustrated in FIG. 3 are two of the nozzles 24. It will be appreciated that the interior passages through nozzles 24 are generally conical or frusto-conical in shape with the diameter decreasing along the path of the fluid flow, thereby increasing the flow velocity into mixing section 25. The increased velocity induces additional fluid to flow into the sleeve through the annular opening 29 between the nozzles 24 and the mixer sleeve inlet as indicated by the arrows in FIG. 2.

In accordance with a preferred embodiment of the present invention, the inlet-mixer is provided with a coating that inhibits or eliminates "crud" build-up. To accomplish this, the inlet-mixer 23 is placed in a chemical vapor deposition ("CVD") reactor. The reactor is a heated vacuum vessel that is sufficiently large to house the part being coated. The vessel is then evacuated and the pressure is dropped to approximately 20 mTorr. Heat is applied to raise the temperature of the vessel and the part being coated to a reaction temperature sufficient to decompose an organometallic source gas, typically within a range of about 400°-500° C. and preferably about 450° C.

When the reactor vessel reaches the reaction temperature and pressure, chemical precursors, such as one or more organometallic precursor or source gases are injected into the reactor chamber. The precursor gas(es) impinge on the surface of the heated inlet-mixer part and thermally decompose to form a metal oxide insulator coating corresponding to the metallic portion of the source gas(es) and byproduct gases. For example, source gases such as $Ti(OC_2H_5)_4$ and $Ta(OC_2H_5)_5$ are useful for forming the corresponding oxides $TiO_2$ and $Ta_2O_5$.

Depending on the selection of the precursor gas(es), this method may be used to deposit layers including such metallic oxides as $TiO_2$, $Ta_2O_5$, $SiO_2$, $Al_2O_3$, $ZrO_2$, $Nb_2O_5$, $SrBi_2$, $Ta_2O_3$, $Y_2O_3$, $HfO_2$, $BaO$, $SrO$, $SrTiO_3$, $PbTiO_3$, and $PbZrO_3$, and byproduct gases that are evacuated from the reactor vessel. The deposition process is maintained for a period sufficient to achieve a base metal oxide coating of the desired thickness, typically between about 0.1 and 2 µm, after which the gas flow of the first precursor gas(es) is terminated.

The reactor vessel may then be purged with an inert gas or gases to remove the initial precursor gas(es) while generally maintaining the reactor pressure and temperature. After the majority of the initial precursor gas(es) have been removed from the reactor, a different organometallic precursor or source gas or mixture of such gases is introduced into the reactor chamber. The precursor gas(es) impinge on the surface of the first metal oxide insulator layer formed on the heated inlet-mixer part and thermally decompose to form a second metal oxide insulator coating corresponding to the metallic portion of the source gas(es) and byproduct gases.

When a sufficiently thick coating is achieved, e.g., within a range of about 0.5 to about 3.0 µm, heating is terminated and the reactor vessel and the coated part are cooled. Once the temperature is sufficiently low, the vacuum is released and the reactor chamber opened to allow removal of the coated part. This technique may be used to form the coating 31 as illustrated in FIGS. 2 and 3 along the interior wall surfaces of the inlet-mixer 23.

The multi-layer coating process for the high flow surfaces of the jet pump or other parts exposed to such high flow conditions provides for the application of an initial or base dielectric coating of relatively smaller thickness (e.g., about 0.1 to about 0.5 µm) which exhibits improved adherence to the base material and provides a clean surface for the application of the second or outer dielectric coating. The second or outer dielectric coating may then be selected to provide sufficient adherence to the initial or base dielectric coating while providing improved resistance to the anticipated operating environment.

Figure 4A:
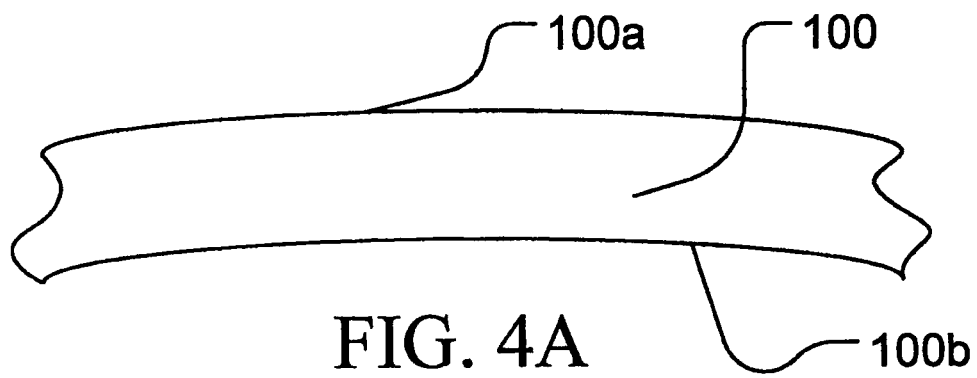
FIGS. 4A-4C are cross-sectional views of a portion of a coated surface during the coating process.
Figure 4B:
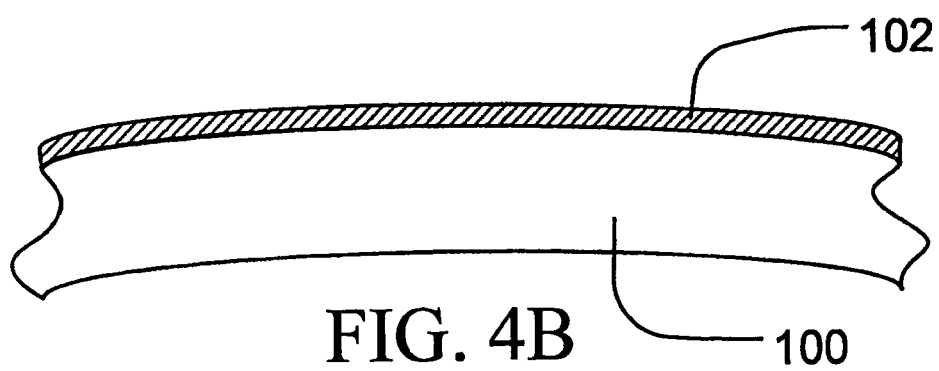
Figure 4C:
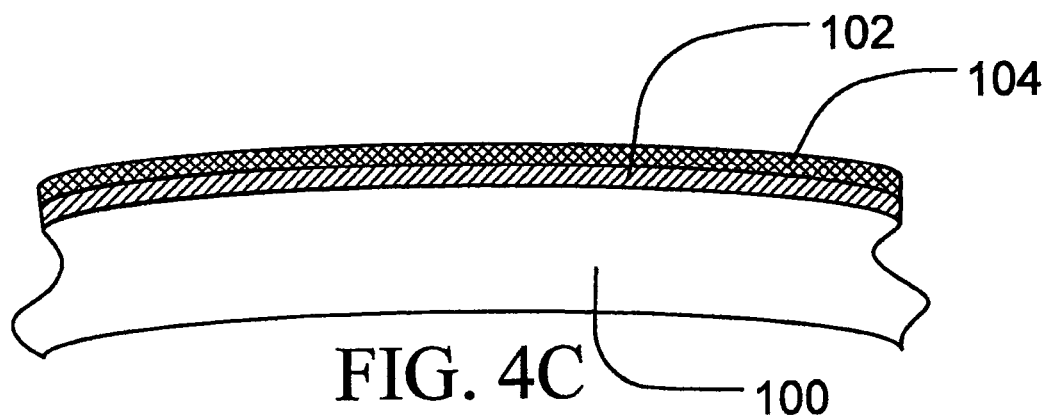

As illustrated in FIGS. 4A-4C, a part fabricated from a conductive base material 100 and having one or more wetted surfaces 100a, 100b, that may be exposed to high velocity fluid flow during operation. Depending on the intended application for the part, one or both (not shown) of the surfaces may be coated with a protective dielectric coating. As illustrated in FIG. 4B, surface 100a is initially coated with a first or base dielectric layer or coating 102, the coating material and application method being selected to provide improved adhesion between the coating and the surface.

As illustrated in FIG. 4C, after forming the base dielectric layer 102, a second dielectric layer 104 is applied to the base dielectric layer to form the outer surface of the coated part. The coating material and the application method used for the second dielectric layer are typically selected to provide adequate adhesion to the base layer to prevent delamination while also providing improved corrosion and/or erosion corrosion resistance in the anticipated operating environment relative to that achieved by the base layer material.

A suitable initial or base coating material is the tantalum oxide material tantala ($Ta_2O_5$) that may be used in combination with a second or outer coating layer of the titanium oxide material titania ($TiO_2$). Although described above as a simple dual-layer coating, those of ordinary skill will appreciate that, depending on the materials and application methods, each of the coatings illustrated in FIGS. 4B-4C may actually comprise a series of thinner sublayers of substantially uniform composition or a series of sublayers that exhibit a predetermined range of compositions in a direction substantially normal to the coated surface 100a. Similarly, one or more additional layers (not shown) may be formed between the base layer 102 and the outer layer 104 to improve the structural integrity of the composite coating or improve other properties of the coating with respect to, for example, chemical resistance.

As noted above, a wide range of metal oxide dielectrics may be used to form the base and outer coatings, including, for example, zirconia, silica, alumina, or other metal oxide that exhibits sufficient chemical and mechanical resistance to anticipated operating environment. The CVD process as described above, or another gas phase deposition process such as Atomic Layer Deposition (ALD), are generally suitable for forming a conformal surface coating on a complex three-dimensional surface. Depending on the size and configuration of the surface(s) being coated, physical vapor deposition (PVD), plasma enhanced physical vapor deposition (PEPVD) and radio frequency (RF) sputtering may also be suitable for forming layers including one or more of the oxides noted above.

Similarly, depending on the configuration of the part and the accessibility of the surface to be coated, other methods of applying protective material layer could also be utilized to form the base coating and/or the outer coating. These methods may include electric arc spraying (EAS), plasma spray coating processes, also referred to as plasma arc spraying (PAS) processes, which can be conducted at atmospheric pressure (APS), under a vacuum (VPS), or in the presence of a low pressure inert gas (LPPS), high velocity oxy-fuel (HVOF) processes and/or other conventional coating processes that are capable of producing the appropriate dielectric layers of sufficient thickness and uniformity.

The initial dielectric coating, such as $Ta_2O_5$, allows for increased electrical resistance against fouling and adherence of the outer coating to the part, thereby suppressing delamination. The outer coating, such as $TiO_2$, may then be selected to provide improved resistance to the jet pump environment while exhibiting good adherence to the initial or intermediate coatings and to reduce or eliminate surface fouling. This same dual-coat approach may be applied to replacement components such as core spray piping to improve resistance to stress corrosion cracking. Other parts that could benefit from a dielectric coating include impellers, flow elements, valves, other application which are exposed to high flow water and susceptible to fouling from the charged ions in the fluid.

It is anticipated that $Ta_2O_5$ will be suitable for forming an initial coating that will provide both sufficient electrical resistance and sufficient adhesion on a range of base metals, such as stainless steel, used in fabricating the parts. It is also anticipated that $TiO_2$ will be suitable for forming an outer layer on a $Ta_2O_5$ base coating that will exhibit both sufficient adherence to the underlying $Ta_2O_5$ layer while improving the corrosion resistance in a BWR environment over that exhibited by $Ta_2O_5$. It is anticipated that the multi-layer $Ta_2O_5$/$TiO_2$ dielectric coating will outperform a single dielectric coat of $Ta_2O_5$ or $TiO_2$ having the same thickness in BWR applications, including jet pump surfaces.

It will be appreciated by those of ordinary skill in the art that the coating process as described above may incorporate additional steps such as a cleaning or etching step to prepare the surface of the part being coated to receive the base dielectric coating and improve the adhesion of the base layer. Similarly, although the process as generally been described as a dual layer process, it will be appreciated that one or more intermediate layers may be provided to allow for more precise control of the characteristics of the coating. In addition, additional surface treatments such as nitridation or other surface modification processes may be utilized to increase the resistance of the outer layer to the anticipated operating environment for the coated part.

While the invention has been described in connection with what are presently considered to be practical and representative exemplary embodiments, it is to be understood that the invention is not to be limited to the disclosed embodiment, but on the contrary, is intended to cover various modifications and equivalent arrangements included within the spirit and scope of the appended claims.

The invention claimed is:

1. An apparatus defining a coolant flow passage in a nuclear reactor, the apparatus comprising:
    a base material, the base material being electrically conductive and having a surface configured to define a portion of the coolant flow passage;
    a base dielectric layer formed on the surface of the base material, the base dielectric layer being substantially continuous, the base dielectric layer being a $Ta_2O_5$ layer; and
    an outer dielectric layer formed on the base dielectric layer, the outer dielectric layer being substantially continuous, the outer dielectric layer defining a wetted surface in the coolant flow passage, the outer dielectric layer being a $TiO_2$ layer, the outer dielectric layer being thicker than the base dielectric layer,
    wherein the outer dielectric layer has a thickness between about 0.5 to 3 μm.

2. The apparatus of claim 1, wherein the base dielectric layer has a thickness between about 0.1 to 2 μm.

3. The apparatus of claim 2, wherein the base dielectric layer has a thickness between about 0.1 to 0.5 μm.

4. The apparatus of claim 1, wherein the base dielectric layer has a thickness between about 0.1 to 0.5 μm.

* * * * *